(12) United States Patent
Ueda

(10) Patent No.: US 11,887,935 B2
(45) Date of Patent: Jan. 30, 2024

(54) SEMICONDUCTOR DEVICE AND MANUFACTURING METHOD THEREOF

(71) Applicant: RENESAS ELECTRONICS CORPORATION, Tokyo (JP)

(72) Inventor: Takehiro Ueda, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 17/345,399

(22) Filed: Jun. 11, 2021

(65) Prior Publication Data

US 2022/0399281 A1 Dec. 15, 2022

(51) Int. Cl.
*H01L 23/544* (2006.01)
*H01L 21/304* (2006.01)
(Continued)

(52) U.S. Cl.
CPC .......... *H01L 23/544* (2013.01); *H01L 21/304* (2013.01); *H01L 22/12* (2013.01); *H01L 22/32* (2013.01); *H01L 23/3171* (2013.01); *H01L 23/4824* (2013.01); *H01L 29/402* (2013.01); *H01L 29/7813* (2013.01); *H01L 22/00* (2013.01); *H01L 2223/5444* (2013.01);
(Continued)

(58) Field of Classification Search
CPC ......... H01L 23/544; H01L 2223/54433; H01L 2223/5444; H01L 2223/54453; H01L 2223/5448; H01L 21/304
See application file for complete search history.

(56) References Cited

U.S. PATENT DOCUMENTS 10,381,311 B2 * 8/2019 Meyer ................... B81C 99/007
2005/0082693 A1 * 4/2005 Fujimoto .............. H01L 23/544
257/E23.179
(Continued)

FOREIGN PATENT DOCUMENTS

JP 2004-055882 A 2/2004

OTHER PUBLICATIONS

Extended European Search Report issued in corresponding European Patent Application No. 22177414.4-1212, dated Nov. 7, 2022.

*Primary Examiner* — Bilkis Jahan
*Assistant Examiner* — Victor V Barzykin
(74) *Attorney, Agent, or Firm* — Rimon P.C.

(57) ABSTRACT

A method for manufacturing a semiconductor device includes forming semiconductor devices from a semiconductor wafer and identifying a position of the semiconductor device in the semiconductor wafer, wherein the forming the semiconductor devices includes forming a first repeating pattern including i semiconductor devices each having a unique pattern, forming a second repeating pattern including j semiconductor devices each having a unique pattern, defining semiconductor devices on the semiconductor wafer such that each of the k semiconductor devices has a unique pattern based on the first and second repeating patterns, and grinding a backside of the semiconductor wafer, wherein each unique pattern of the k semiconductor devices is composed of a combination of the unique patterns of the first and second repeating patterns, wherein the position of the semiconductor device is identified based on the unique patterns of the first and second repeating patterns and an angle of a grinding mark.

12 Claims, 19 Drawing Sheets

(51) Int. Cl.
*H01L 21/66* (2006.01)
*H01L 23/31* (2006.01)
*H01L 23/482* (2006.01)
*H01L 29/40* (2006.01)
*H01L 29/78* (2006.01)

(52) U.S. Cl.
CPC ............ *H01L 2223/5448* (2013.01); *H01L 2223/54433* (2013.01); *H01L 2223/54453* (2013.01)

(56) References Cited

U.S. PATENT DOCUMENTS

| | | | |
|---|---|---|---|
| 2007/0202664 A1 | 8/2007 | Aoki | |
| 2010/0163871 A1* | 7/2010 | Brambilla | H01L 22/20 257/E21.531 |
| 2014/0312878 A1* | 10/2014 | Brambilla | H01L 22/12 257/536 |
| 2016/0351508 A1* | 12/2016 | Kalyanaraman | H01L 23/544 |
| 2018/0247896 A1* | 8/2018 | Meyer | H01L 23/544 |
| 2019/0214348 A1 | 7/2019 | Liu et al. | |

* cited by examiner

SEMICONDUCTOR DEVICE AND MANUFACTURING METHOD THEREOF

BACKGROUND

The present invention relates to a semiconductor device and its manufacturing method and, more particularly, to a semiconductor device and a manufacturing method which identify a position of semiconductor device (semiconductor chip) after dicing within a semiconductor wafer.

Conventionally, in the failure analysis or the like, there is a case where it is necessary to identify a position of semiconductor chip (after dicing) within the semiconductor wafer. As a method for identifying a semiconductor chip position in a semiconductor wafer, a method of forming a unique pattern on each of multifaceted semiconductor chips in a photolithography process, and utilizing grinding marks formed on the back surface of the semiconductor wafer in the grinding process are known.

Patent Document 1 discloses a technique for specifying a position of a semiconductor chip in a wafer surface by capturing grinding marks on the back surface of the semiconductor wafer as image data and performing image processing.

PRIOR-ART DOCUMENT

Patent Document

[Patent Document 1] Japanese Unexamined Publication Laid-Open No. 2004-55882

SUMMARY

However, depending on the semiconductor chip, there is a problem that it may be difficult to identify the position in the wafer. FIGS. 1 to 3 are used to explain in detail. FIG. 1 is a diagram showing grinding marks on the back surface of the semiconductor wafer 100. As shown in FIG. 1, the grinding marks are formed on the back surface of the semiconductor wafer 100 so as to spiral from the center of the semiconductor wafer 100. FIG. 1 is a simplified image diagram. In an actual semiconductor wafer, finer (more lines and narrower distance between lines) grinding marks are formed than shown in FIG. 1.

FIG. 2 shows the semiconductor wafer 100 in which multifaceted semiconductor chips are formed. As shown in FIG. 2, semiconductor chips are assigned to the semiconductor wafer 100 in a photolithographic process such that a multi-faceted pattern 101 (consisting of six semiconductor chips in two rows and three columns) is repeated. FIG. 3 shows an example of the multi-faceted pattern 101. As shown in FIG. 3, the multi-faceted pattern 101 is composed of six semiconductor chips A-F of two rows and three columns.

Here, focusing on the semiconductor chips 102 and 103 in FIG. 2. Semiconductor chips 102 and 103 correspond to semiconductor chip E, and have almost the same grinding marks. In this case, it becomes difficult to identify the positions of semiconductor chips 102 and 103 in the semiconductor wafer.

Other objects and novel features will become apparent from the description of the specification and drawings.

A method for manufacturing a semiconductor device according to an embodiment includes forming semiconductor devices from a semiconductor wafer and identifying a position of the semiconductor device in the semiconductor wafer, wherein the forming the semiconductor devices includes forming a first repeating pattern including i semiconductor devices each having a unique pattern, forming a second repeating pattern including j semiconductor devices each having a unique pattern, defining semiconductor devices on the semiconductor wafer such that each of the k semiconductor devices has a unique pattern based on the first and second repeating patterns, and grinding a backside of the semiconductor wafer, wherein each unique pattern of the k semiconductor devices is composed of a combination of the unique patterns of the first and second repeating patterns, wherein the position of the semiconductor device is identified based on the unique patterns of the first and second repeating patterns and an angle of a grinding mark of the semiconductor device.

A semiconductor device according to an embodiment includes a trench gate having a first unique shape to distinguish from other semiconductor devices fabricated on the same semiconducting wafer, a gate pad or source pad having a second unique shape to distinguish from other semiconductor devices fabricated on the same semiconductor wafer, and a wafer grinding mark formed on the backside of the semiconductor device.

According to the present invention, it is possible to accurately identify the position of the target semiconductor chip in the semiconductor wafer.

DETAILED DESCRIPTION

Figure 1:
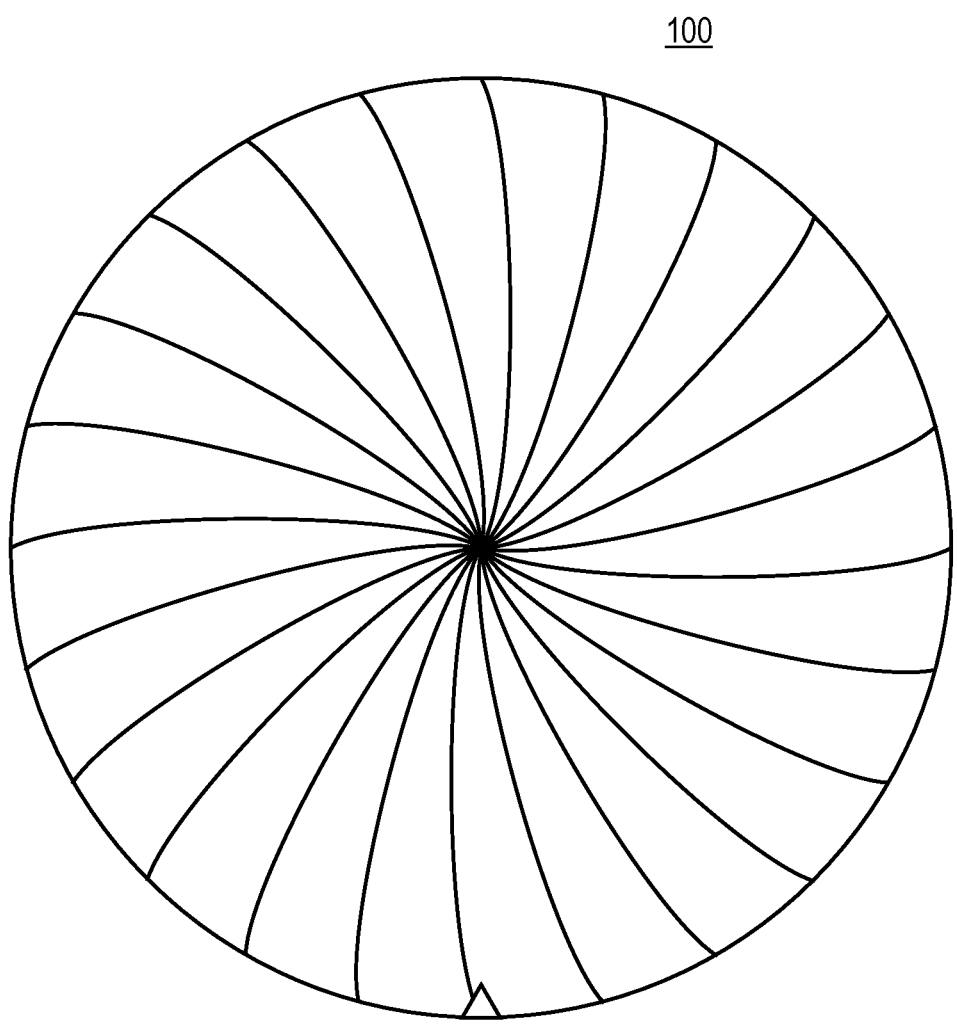
FIG. 1 is a plan view of a backside of a semiconductor wafer.
Figure 1:
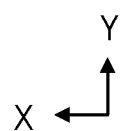
Figure 2:
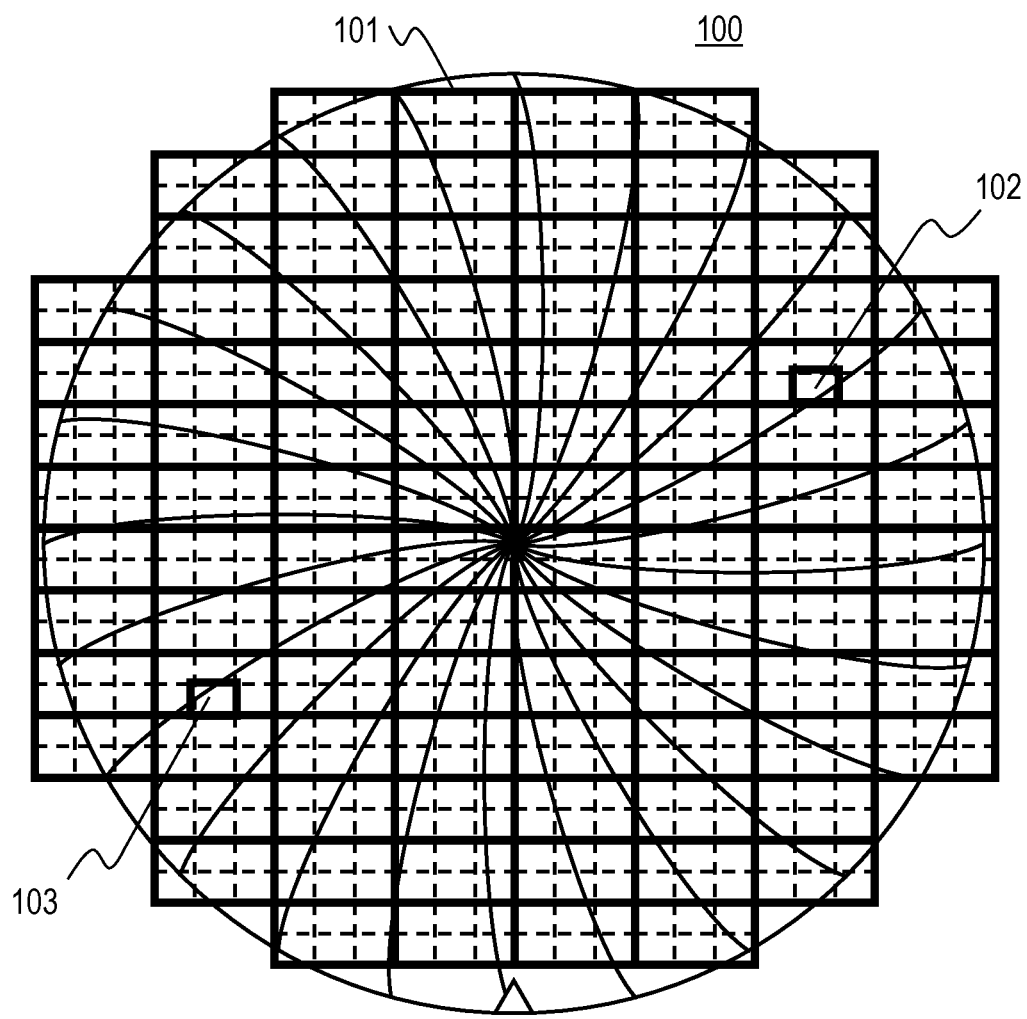
FIG. 2 shows a plan view of a backside of a conventional semiconductor wafer.

Hereinafter, a semiconductor device according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

First Embodiment

Figure 4:
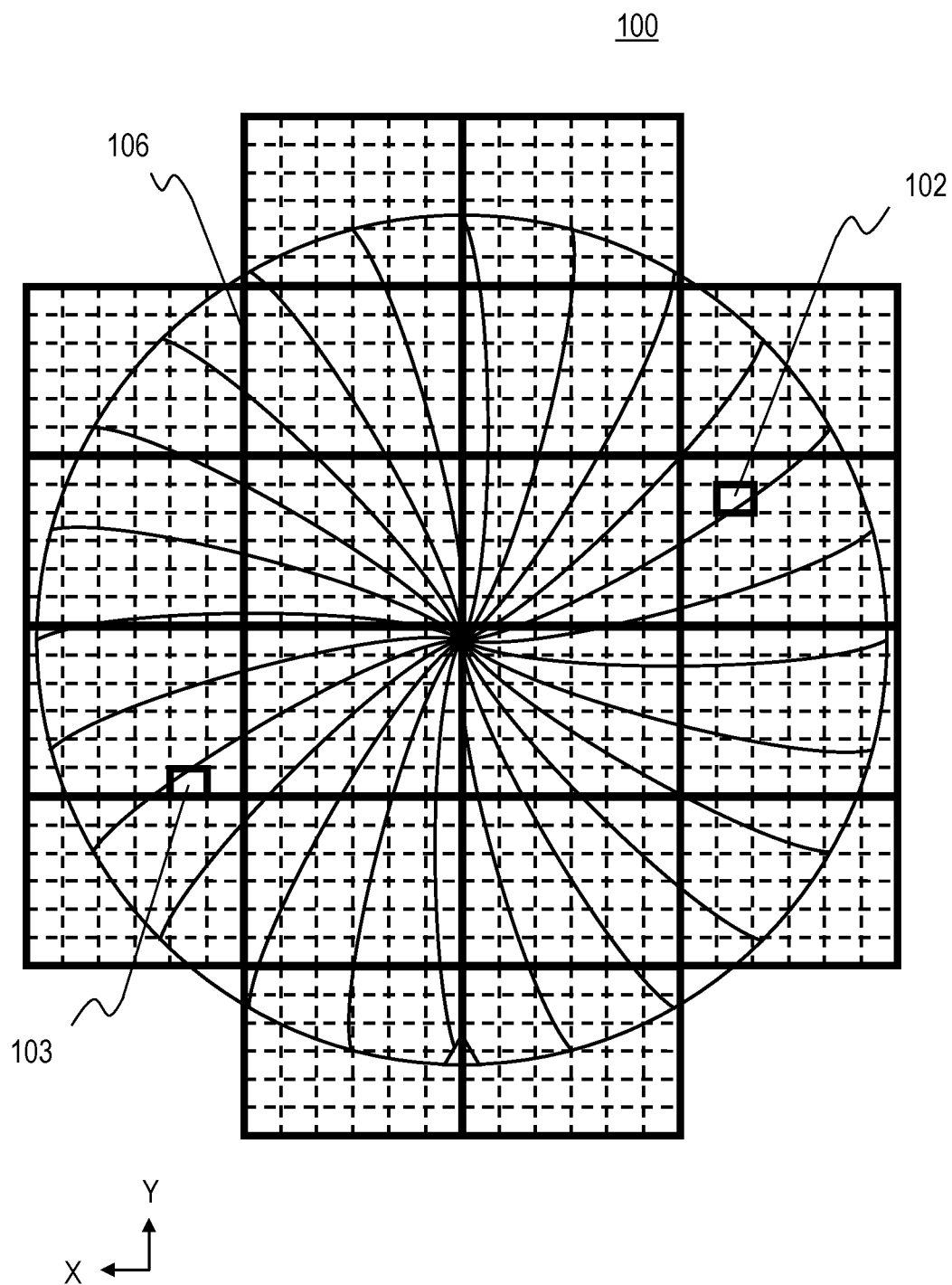
FIG. 4 is a plan view of a backside view of a semiconductor wafer according to first embodiment.

FIG. 4 is a diagram illustrating the backside view of the semiconductor wafer 100 when a repeating pattern 106, which is one of the features of first embodiment, is applied to the semiconductor wafer 100. As shown in FIG. 4, the repeating pattern 106 is composed of 36 semiconductor chips (semiconductor devices) of 6 rows and 6 columns. Each of the semiconductor chips allocated to the semiconductor wafer 100 is distinguishable by the repeating pattern 106.

Next, with reference to FIGS. 3 and 5 to 8, a method for identifying the semiconductor chip position (after dicing) in the semiconductor wafer and a manufacturing method of the semiconductor device will be described. The manufacturing process of the semiconductor device includes many steps other than the steps described herein, but the following descriptions only describe the characteristic portions of the first embodiment.

Figure 3:
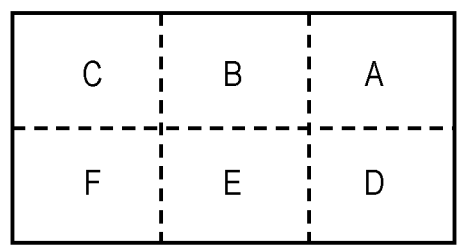
FIG. 3 is a backside view of a first repeating pattern according to first embodiment.
Figure 3:
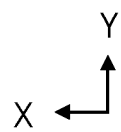

First, the repeating pattern 106 will be described. The repeating pattern 106 is defined by at least two repeating patterns. The first repeating pattern (also referred to as a first granularity repeating pattern) is a multifaceted pattern 101 in conventional photolithography. That is, as shown in FIG. 3, the first repeating pattern 101 is composed of six semiconductor chips A to F of two rows (Y direction) three columns (X direction) (step S100). Here, a unique pattern is formed on each of the semiconductor chips A to F. Each of the semiconductor chips A-F can be identified by the unique pattern. The unique patterns formed on semiconductor chips A to F are collectively referred to as first unique pattern. Details of the first unique pattern will be described later.

Figure 5:
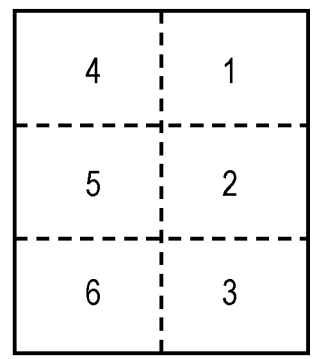
FIG. 5 is a backside view of a second repeating pattern according to first embodiment.
Figure 5:
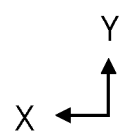

Next, a second repeating pattern (also referred to as a second granularity repeating pattern) 104 is formed (step S101). FIG. 5 is a diagram showing the second repeating pattern 104. The second repeating pattern 104 is a parallel unit of measurement (a unit of needle placement by a probe card) in a wafer testing process. The second repeating pattern 104 is composed of six semiconductor chips 1-6 in three rows (Y direction) and two columns (X direction) as shown in FIG. 5. Each of the semiconductor chips 1-6 is formed with a unique pattern. Each of the semiconductor chips 1-6 can be identified by the unique pattern. The unique patterns formed on semiconductor chips 1-6 are collectively referred to as second unique pattern. Details of the second unique pattern will be described later.

Figure 6:
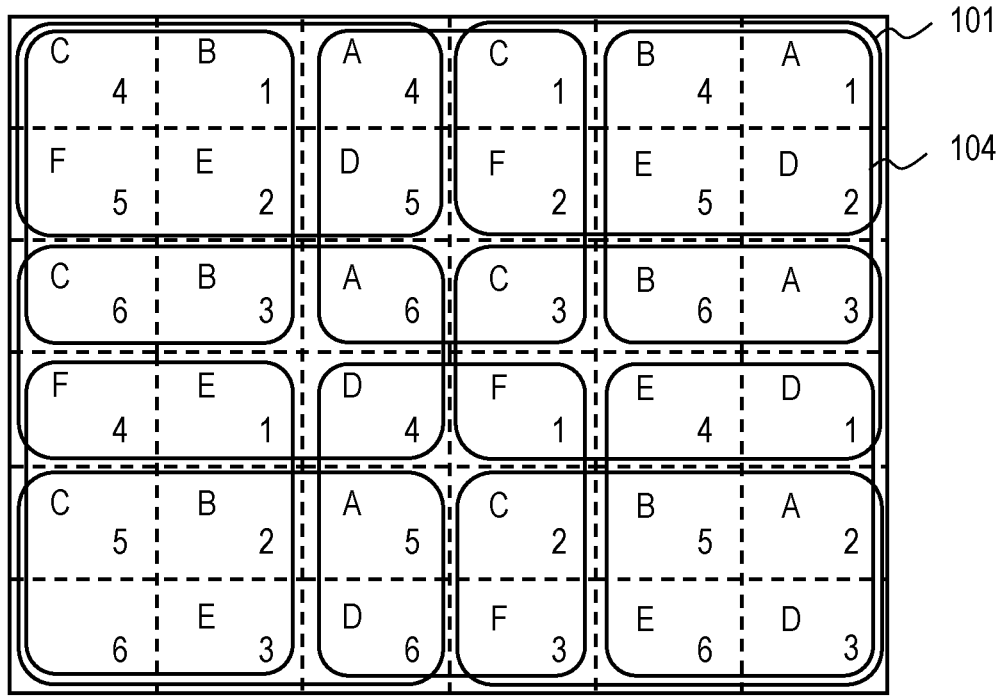
FIG. 6 is a backside view of a third repeating pattern according to first embodiment.
Figure 6:
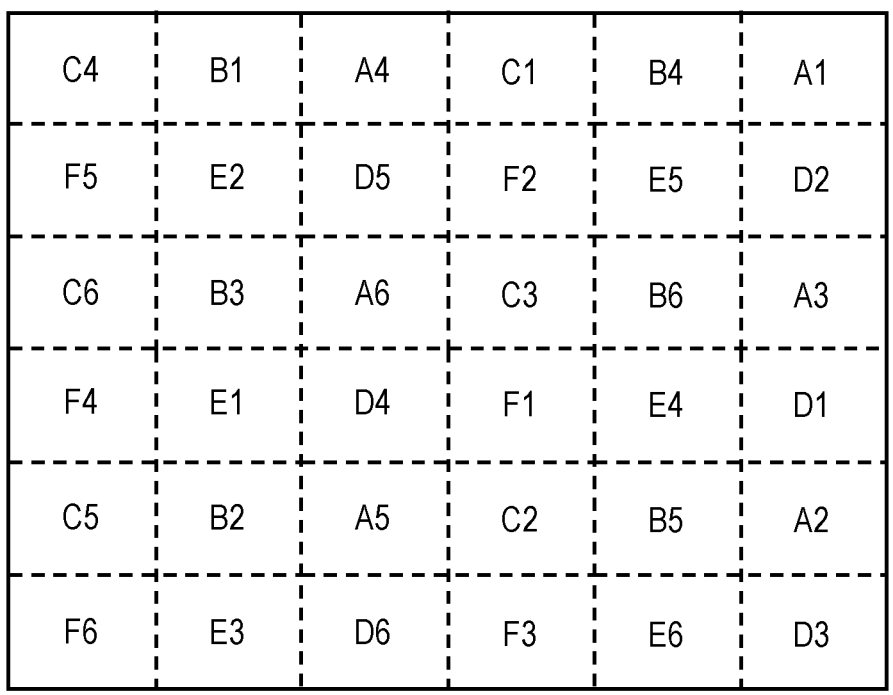
Figure 7:
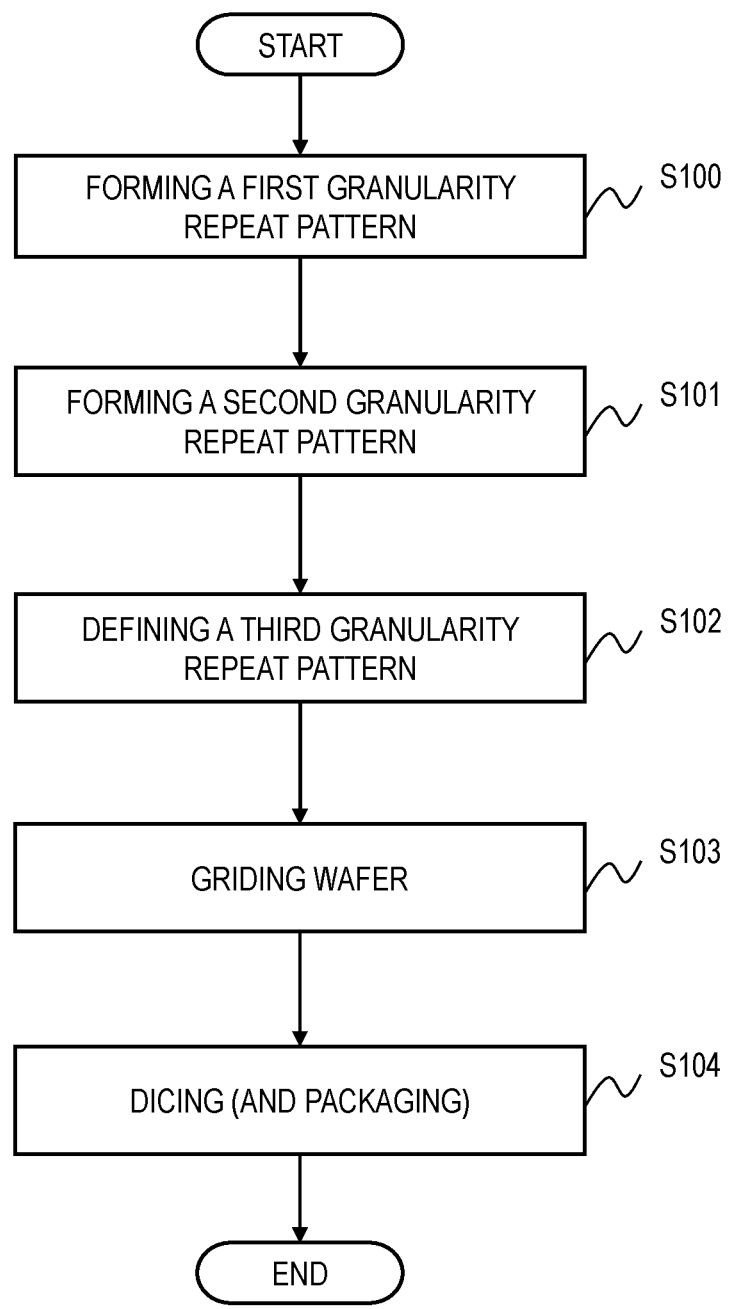
FIG. 7 is a flow chart for explaining manufacturing method of the semiconductor chip according to first embodiment.
Figure 8:
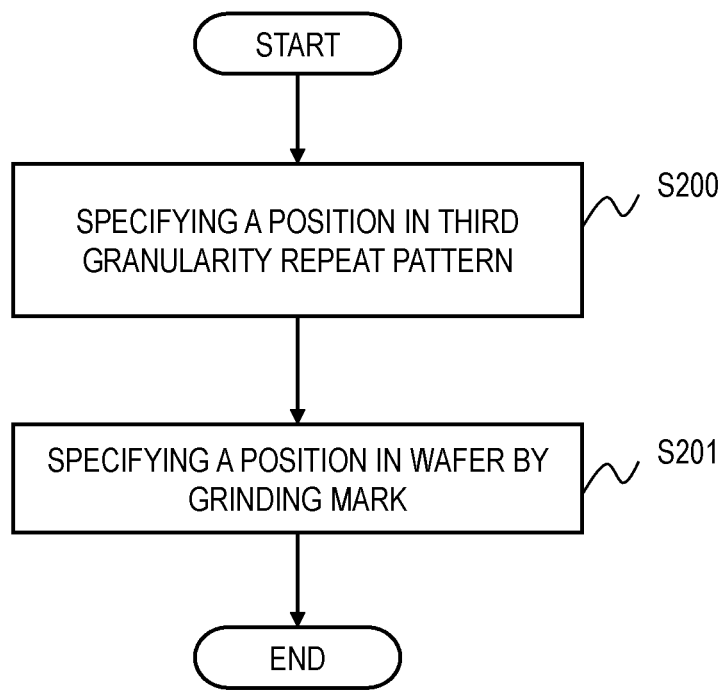
FIG. 8 is a flow chart for explaining a method for identifying the semiconductor chip position in the semiconductor wafer according to first embodiment.

The first and second repeating patterns are then combined to define a repeating pattern 106 (also referred to as a third repeating pattern or a third granularity repeating pattern) (step S102). Specifically, as shown in 105 in FIG. 6, the repeating pattern 106 is defined by arranging the first repeating pattern 101 in three rows (Y direction) and two columns (X direction), the second repeating pattern 104 in two rows (Y direction) and three columns (X direction). 106 in FIG. 6 shows a state in which A1 to F6 are allocated again to each of the semiconductor chips of 105. As a result, the repeating pattern 106 will be composed of 36 semiconductor chips A1-F6. Here, the semiconductor chip A1 can be specified by having the unique patterns (to be described later) corresponding to the semiconductor chip A and the semiconductor chip 1. The same applies to semiconductor chips A2 to F6.

After a plurality of semiconductor chips are formed on the semiconductor wafer using the first and second repeating patterns, the semiconductor wafer 100 is ground for the purpose of making any thickness or the like (step S103). After grinding, in the back surface of the semiconductor wafer 100, the grinding marks described above are formed.

Each semiconductor chip assigned to the semiconductor wafer 100 undergoes a dicing, packaging step (step S104) to become a final semiconductor product.

Next, the method for identifying the semiconductor chip position in the semiconductor wafer will be described. First, the unique pattern formed on the semiconductor chip to be analyzed is confirmed. As described above, the semiconductor chip is formed with a unique pattern corresponding to A1 to F6. By the unique pattern, a position in the repeating pattern 106 of the semiconductor chip to be analyzed is identified (step S200).

Furthermore, based on the grinding marks on the back surface of the semiconductor chip to be analyzed, a position in the semiconductor wafer of the semiconductor chip is identified (step S201). A method for identifying the semiconductor chip position in the semiconductor wafer based on the grinding marks will be described later.

Figure 9:
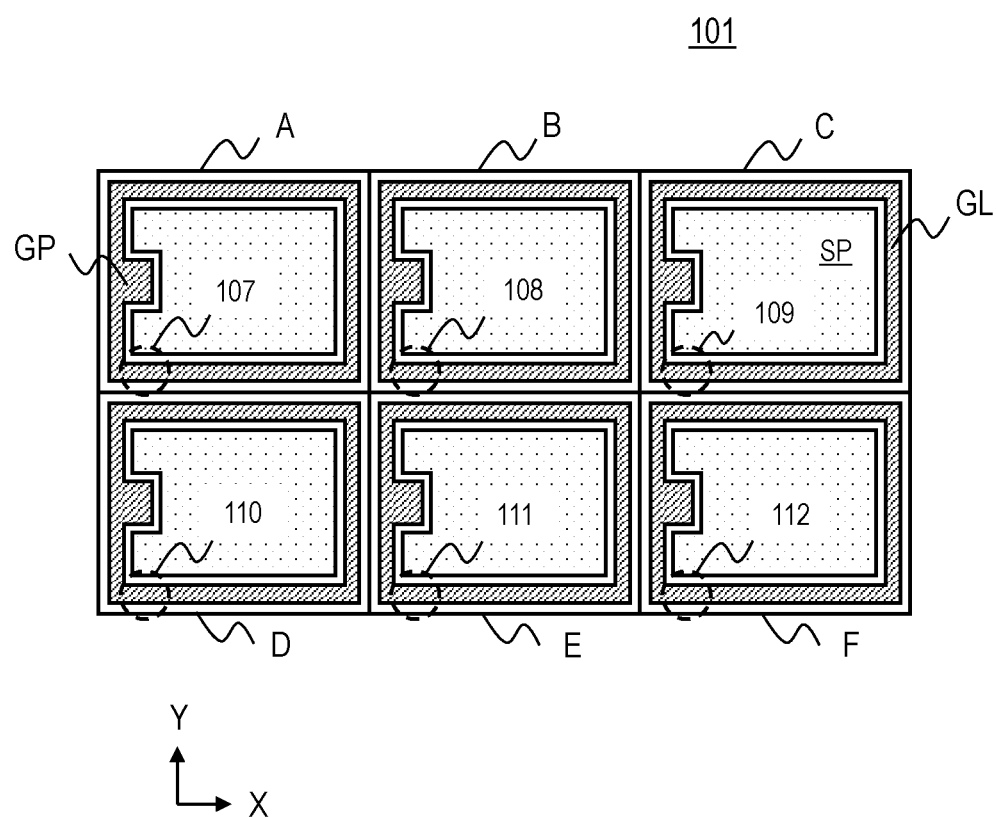
FIG. 9 is a frontside view of semiconductor chips in the first repeating pattern according to first embodiment.
Figure 10:
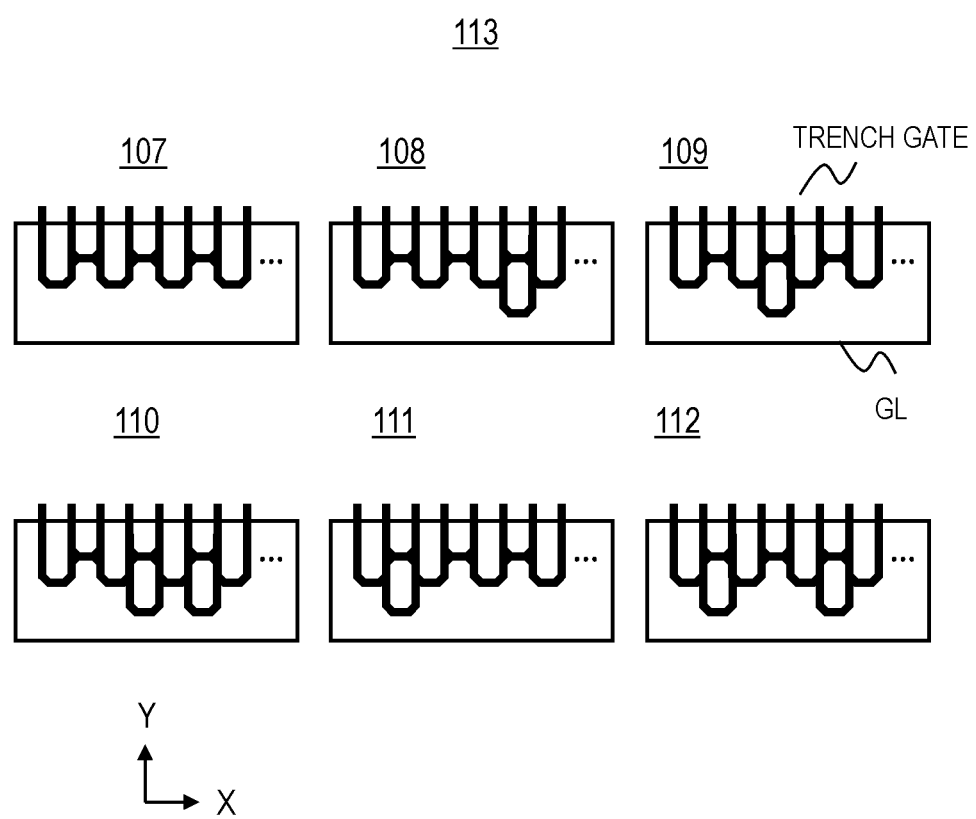
FIG. 10 is frontside view of first unique pattern according to first embodiment.

Next, the first and second unique patterns described above will be described. Here, as an exemplary semiconductor chip will be described with a power MOSFET having trench gates. FIGS. 9 and 10 are diagrams for explaining the first unique pattern 113 formed on the semiconductor chips A to F included in the first repeating pattern 101. On each surface of the semiconductor chips A to F, a source pad (SP), a gate pad (GP), and a gate wiring (GL) are formed as shown in FIG. 9. Below the source pad and the gate pad, trench gates, a source region, a drift region, etc. are formed, but since these are the same construction as a common power MOSFET, the description thereof will be omitted.

FIG. 10 is an enlarged view of regions 107-112 of FIG. 9. Each of the semiconductor chips A-F has a plurality of trench gates extending in the Y-axis direction. Regions 107-112 are regions at the ends of the trench gates. Trench gates, at the ends, are connected to the gate wiring GL (connection contact is not shown). As shown in FIG. 10, the first unique pattern 113 is that each of the semiconductor chips A-F has a different shape at the ends of the trench gates. For example, comparing 107 (semiconductor chip A) and 108 (semiconductor chip B) in FIG. 10, 108 has one additional trench gate portion at the trench gate end. The numbers and locations of additional trench gate portions similarly allows for identification of 109-112. Therefore, by confirming the trench gate ends of the semiconductor chip to be analyzed, it is possible to identify which of the semiconductor chips A to F the semiconductor chip to be analyzed corresponds to.

Figure 11:
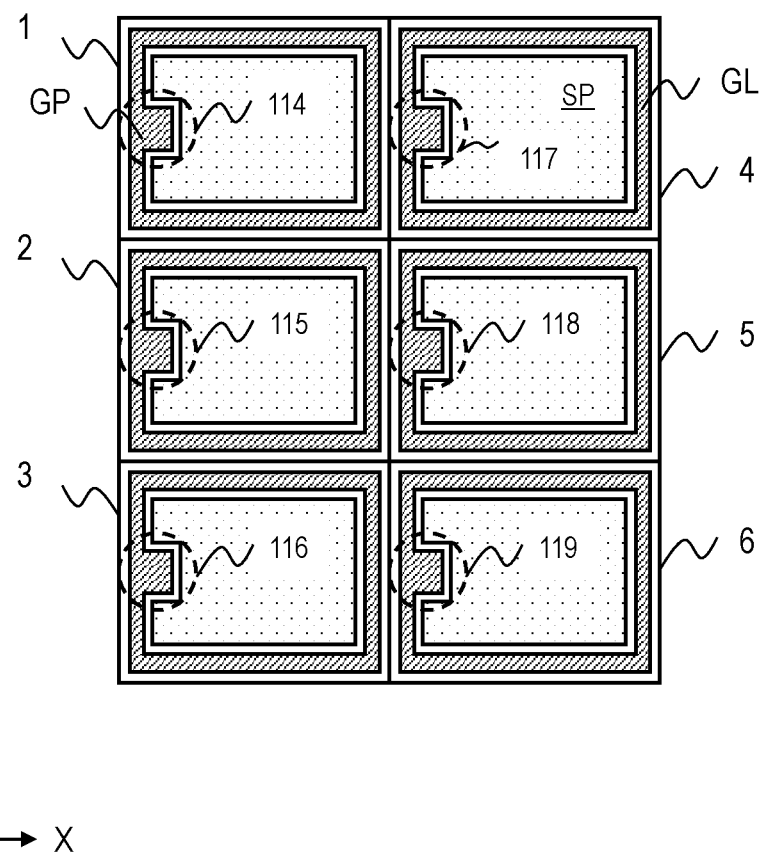
FIG. 11 is a frontside view of semiconductor chips in a second repeating pattern according to first embodiment.
Figure 12:
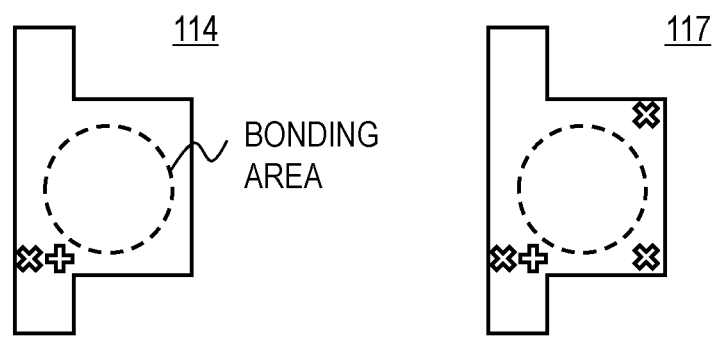
FIG. 12 is frontside view of second unique pattern according to first embodiment.
Figure 12:
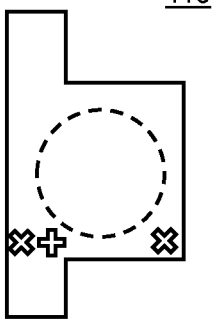
Figure 12:
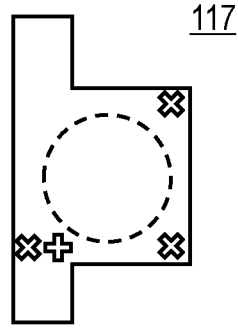
Figure 12:
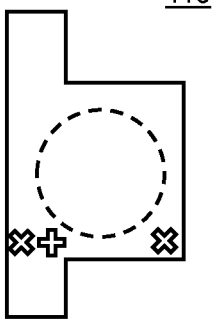
Figure 12:
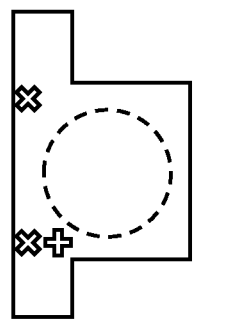
Figure 12:
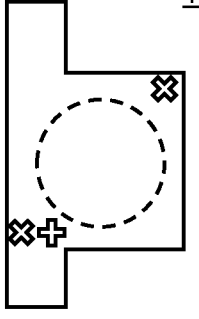
Figure 12:
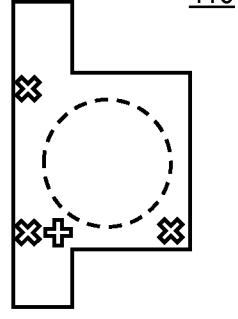
Figure 12:
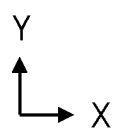
Figure 12:
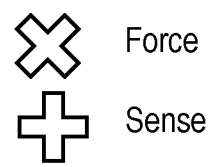

FIGS. 11 and 12 are diagrams for explaining the second unique pattern 120 formed in the semiconductor chips 1 to 6 included in the second repeating pattern 104. FIG. 12 is an enlarged view of the gate pad regions 114-119 of FIG. 11. Needles from the prober are dropped onto the pads of the semiconductor chip during the wafer testing process. The second unique pattern 120 is formed by needle marks on the gate pad GP. In FIG. 12, "Force" indicates a needle mark in which a needle for causing a test current to flow is dropped. "Sense" indicates a needle mark in which a needle for measuring voltage is dropped. The shapes of the needle marks shown in FIG. 12 are for the sake of clarity, and do not show the actual shapes of the needle marks. In first embodiment, as shown in FIG. 12, each of the semiconductor chips 1-6 can be identified by the numbers and positions of needle marks. For example, comparing 114 (semiconductor chip 1) and 115 (semiconductor chip 2) in FIG. 12, one Force is added on 115. Likewise, each of 116 to 119 can be identified by the numbers and positions of Force/Sense. Therefore, by confirming the needle marks on the gate pad GP of the semiconductor chip to be analyzed, it is possible to identify which of the semiconductor chips 1 to 6 the semiconductor chip to be analyzed corresponds to.

The repeating pattern 106 will be described again. The repeating pattern 106 is composed of 36 semiconductor chips A1-F6 as described above. The semiconductor chip A1 has the feature (107) of the semiconductor chip A of the first unique pattern, and the feature (114) of the semiconductor chip 1 of the second unique pattern. The same applies to semiconductor chips A2 to F6. Therefore, by confirming the first and second unique patterns, it is possible to specify which of the semiconductor chips A1 to F6 the semiconductor chip to be analyzed corresponds to.

Figure 13:
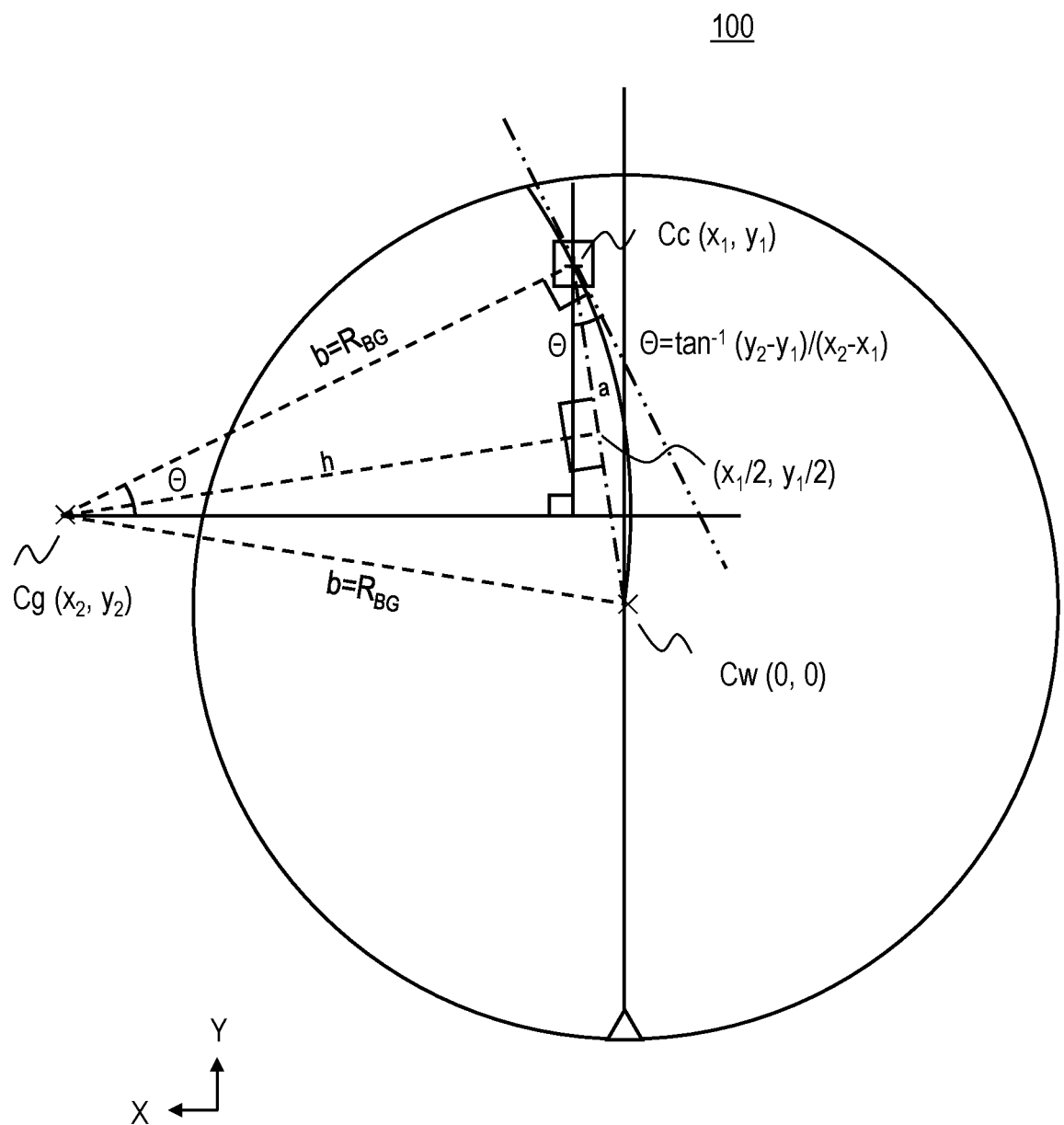
FIG. 13 is a diagram (backside) for explaining a method for identifying the semiconductor chip position in the semiconductor wafer by the grinding marks according to first embodiment.

Next, the method for identifying the semiconductor chip position in the semiconductor wafer using the grinding marks on the back surface of the semiconductor wafer will be described. FIG. 13 is a diagram for explaining the method for identifying the semiconductor chip position in the semiconductor wafer. Here, it is assumed that a part of the grinding mark on the back side of the semiconductor wafer is passed through the center Cc ($x_1$, $y_1$) of the target chip and the center Cw (0, 0) of the semiconductor wafer 100 and has an arc shape with a radius $R_{BG}$. The center of the grinding mark on the back side of the semiconductor wafer is Cg ($x_2$, $y_2$). The radius $R_{BG}$ is a constant number determined by the grinding equipment.

In FIG. 13, ΔCwCcCg is an isosceles triangle. Assuming that the length of the base (between Cc and Cw) is "a" and the height (from the midpoint of Cc-Cw to Cg) is "h", the following expression is satisfied.

$$a = \sqrt{x_1^2 + y_1^2} \qquad \text{Expression (1)}$$

$$R_{BG} = \sqrt{x_2^2 + y_2} \qquad \text{Expression (2)}$$

$$h = \sqrt{R_{BG}^2 - (a/2)^2} = \sqrt{R_{BG}^2 - (x_1^2 + y_1^2)/4} \qquad \text{Expression (3)}$$

Further, the following equation is established.

$$h = \sqrt{(x_2 - x_1/2)^2 + (y_2 - y_1/2)^2} \qquad \text{Expression (4)}$$

The equations (1) to (4) are solved for $x_2$, $y_2$ as follows.

$$x_2 = \left\{ x_1^3 + x_1 y_1^2 \pm \sqrt{(x_1^3 + x_1 y_1^2)^2 - 4(x_1^2 + y_1^2)((x_1^2 + y_1^2)^2/4 - y_1^2 R_{BG}^2)} \right\} / 2(x_1^2 + y_1^2) \qquad \text{Expression (5)}$$

$$y_2 = \left\{ y_1^3 + y_1 x_1^2 \pm \sqrt{(y_1^3 + y_1 x_1^2)^2 - 4(x_1^2 + y_1^2)((x_1^2 + y_1^2)^2/4 - x_1^2 R_{BG}^2)} \right\} / 2(x_1^2 + y_1^2) \qquad \text{Expression (6)}$$

Here, when an angle of the grinding mark at the center Cc of the semiconductor chip is θ, the following equation is established.

$$\theta = \tan^{-1}*(y_2 - y_1)/(x_2 - x_1) \qquad \text{Expression (7)}$$

From Equations (5) and (6), it can be seen that $x_2$ and $y_2$ are determined by the center Cc ($x_1$, $y_1$) of the semiconductor chip and the radius $R_{BG}$. Then, from Equation (7), θ is determined by the center Cc ($x_1$, $y_1$) of the semiconductor chip and the radius $R_{BG}$.

For each center of each semiconductor chip in the semiconductor wafer, the angle θ of the grinding mark of the semiconductor wafer back side is determined in advance. By comparing θ obtained in advance with the grinding mark angle at center of the semiconductor chip to be analyzed, it is possible to identify the position in the semiconductor wafer.

Returning to FIG. 4, the effects of the present first embodiment will be described. The semiconductor chips 102 and 103 in FIG. 4, in the prior art, correspond the semiconductor chip E, and have the same grinding marks, it was difficult to identify the positions in the semiconductor wafer of these two chips. On the other hand, in the present first embodiment, by the repeating pattern 106, the semiconductor chip 102 can be determined as the semiconductor chip E2, the semiconductor chip 103 can be determined as the semiconductor chip E6. Therefore, it becomes possible to identify the positions in the semiconductor wafer of these two chips (even if the semiconductor chips 102 and 103 have the same grinding marks).

As described above, in the semiconductor chip (semiconductor device) according to the present first embodiment, forming the repeating pattern 106 from the two repeating patterns, based on the repeating pattern 106, identifying the position in the repeating pattern 106 of the target semiconductor chip. Furthermore, based on the grinding mark angle on the back side of the target semiconductor chip, the position in the semiconductor wafer is identified. Thus, it is possible to accurately identify the position in the semiconductor wafer of the target semiconductor chip. It also does not require image processing, such as in the prior art, for identifying position in the semiconductor wafer. As a result, the cost required for introducing the image processing can be reduced.

The present first embodiment is not limited to the above, and may be variously changed within a range not deviating from the gist thereof. For example, the size of the first repeating pattern 101 is two rows (Y direction) and three columns (X direction), the size of the second repeating pattern is three rows (Y direction) and two columns (X direction), but is not limited thereto. It is desirable that one of the first repeating pattern and the second repeating pattern has an even number size in the X direction, the other has an odd number size in the X direction, and/or that one of the first repeating pattern and the second repeating pattern has an even number size in the Y direction, and the other has an odd number size in the Y direction. In other words, it is assumed that the first repeating pattern is 1 rows and m columns, and the second repeating pattern is n rows and o columns. It is preferable that at least one of a combination of 1 and n and a combination of m and o is a combination of even number and odd number.

The size of the repeating pattern 106 in the X (Y) direction is the least common multiple of the sizes of the first and second repeating patterns in the X (Y) direction.

The first unique pattern 113 is formed at the end of the trench gate, but is not limited thereto. Since the ends of the trench gates are covered with gate wires, the ends of the trench gates may be used to form a first unique pattern 113 with no visual difference between the semiconductor chips. This is advantageous because it does not cause an error in the appearance inspection of the semiconductor chip. The first unique pattern 113 may be formed by what can be seen in appearance (wiring pattern, scribe line, or the like) if a region outside the appearance inspection target can be set or if the appearance inspection does not cause a problem.

The second unique pattern 120 is also formed by the needle marks on the gate pad, but is not limited thereto. The needle marks formed at a location other than the gate pad (e.g., source pad) may be a second unique pattern 120.

Further, the method for identifying the semiconductor chip position in the semiconductor wafer using grinding marks on the back side of the semiconductor wafer may search a semiconductor chip having the same grinding mark on a reference wafer which is ground the same manner as the semiconductor wafer of the target semiconductor chip.

Second Embodiment

In second embodiment, a manufacturing method of semiconductor device and a method for identifying semiconductor device (after dicing) position in a semiconductor wafer are the same as those in first embodiment. Second embodiment uses second and third repeating patterns and second unique pattern that differ from first embodiment. Since the first repeating pattern and the first unique pattern are the same as those of first embodiment (first repeating pattern 101 and first unique pattern 113), detailed description thereof is omitted.

Figure 14:
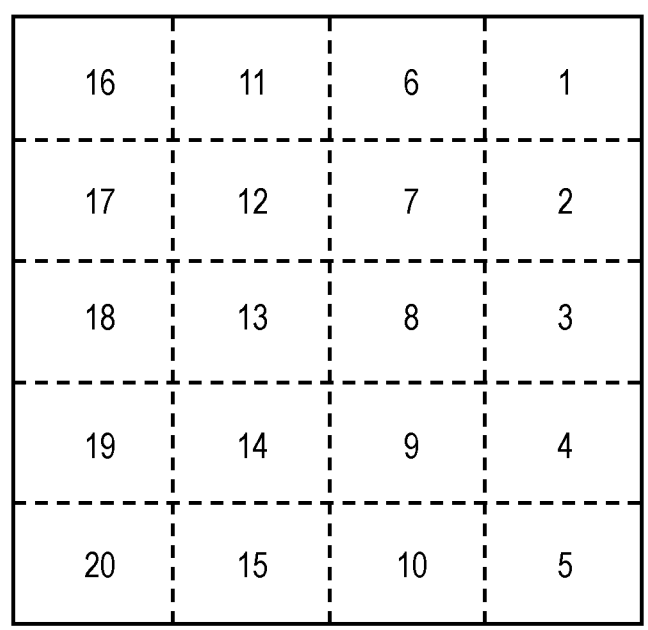
FIG. 14 is a backside view of a second repeating pattern according to second embodiment.
Figure 14:
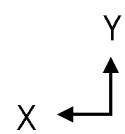

FIG. 14 is a diagram showing the second repeating pattern 104a according to the present second embodiment. As shown in FIG. 14, the second repeating pattern 104a is composed of 20 semiconductor chips 1 to 20 in 5 rows (Y direction) and 4 columns (X direction). A second unique pattern 120a is formed on the semiconductor chips 1 to 20.

Figure 15:
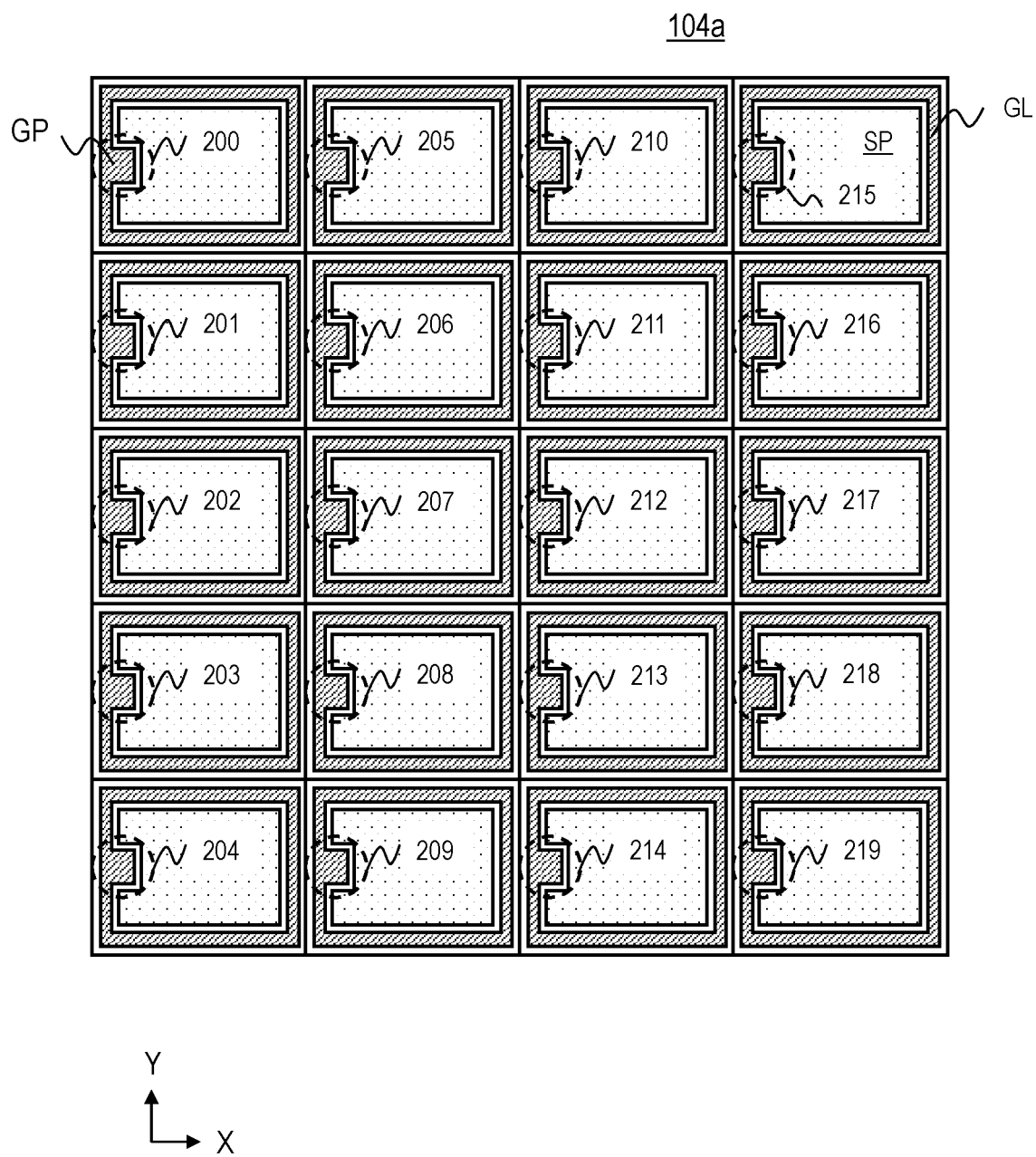
FIG. 15 is a frontside view of semiconductor chips in the second repeating pattern according to second embodiment.
Figure 16:
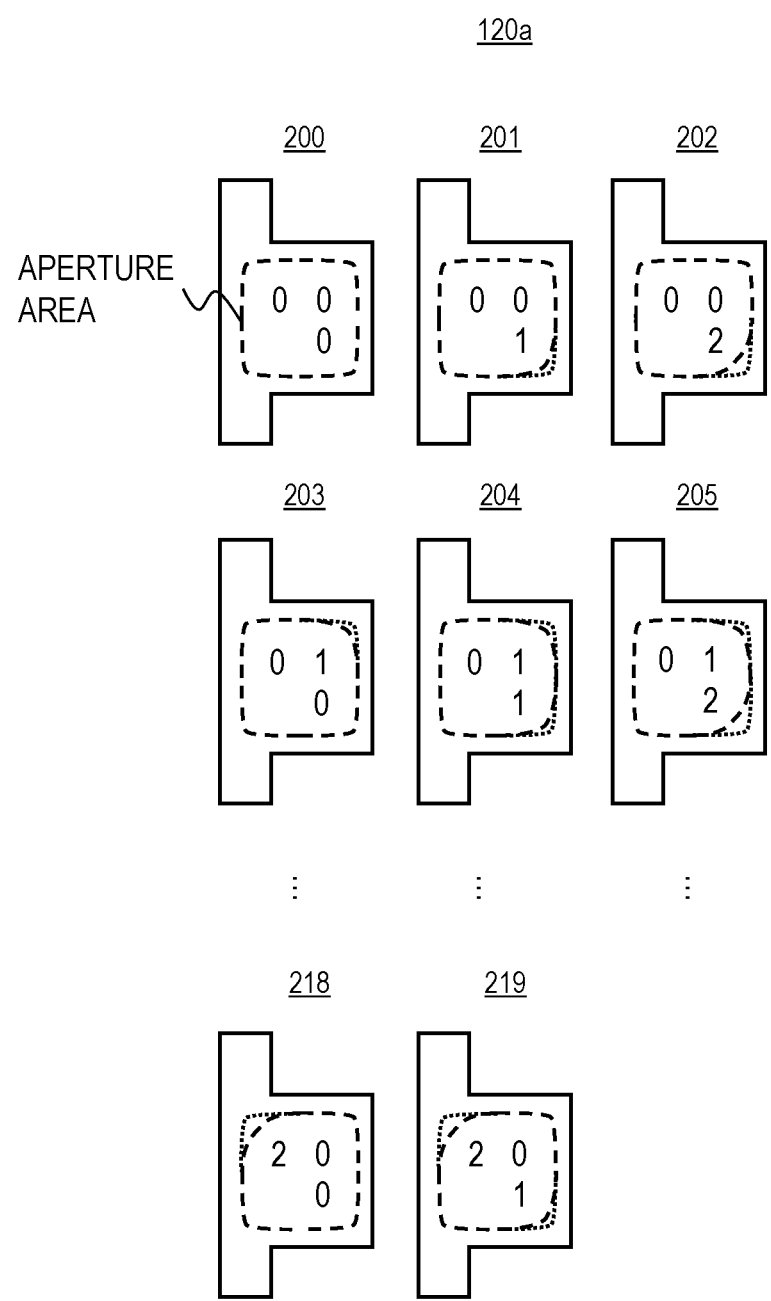
FIG. 16 is frontside view of second unique pattern according to second embodiment.

FIGS. 15 and 16 show specific examples of the second unique pattern 120a formed on the semiconductor chips 1 to 20. Here, as an example of a semiconductor chip, a power MOSFET having a source pad (SP), a gate pad (GP) and a gate wire (GL) will be described. FIG. 15 shows an example of mounting multiple faces of a photolithography process when opening a passivation film.

FIG. 16 is an enlarged view of the gate pad regions 200-219 of FIG. 15. As shown in FIG. 16, the second unique pattern 120a has three types of R (roundness of corners) for three corners of the passivation film aperture area having a substantially rectangular shape. For example, when comparing 200 and 201 in FIG. 16, 201 has a larger R at the lower right corner of the aperture area. Likewise, 202-219 can be identified by the R of the three corners of the aperture area.

Generally, in the photolithography process, a pattern which is about 4 to 5 times the size of the chip on the wafer is formed on an optical mask (reticle), and the pattern is exposed on the wafer by optical reduction. However, in a step that does not require a high resolution such as the passivation film opening process, a pattern as large as twice can be used to increase the number of impositions. In present second embodiment, the second unique pattern 120a are formed by using this. The grain size of the first repeating pattern 101 and the grain size of the second repeating pattern 104a are different from each other. The second unique pattern may be formed in the passivation film aperture area on the source pad rather than on the gate pad.

Figure 17:
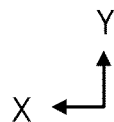
FIG. 17 is a backside view of a third repeating pattern according to second embodiment.

FIG. 17 is a diagram showing the third repeating pattern 106a. Similar to first embodiment, the third repeating pattern 106a is defined by combining the first repeating pattern 101 and the second repeating pattern 104a. As shown in FIG. 17, the third repeating pattern 106a is obtained by arranging the first repeating pattern 101 in 5 rows (Y direction) and 4 columns (X direction), and arranging the second repeating pattern 104a in 2 rows (Y direction) and 3 columns (X direction). The third repeating pattern 106a is composed of 120 semiconductor chips A1 to F20 in 10 rows (Y direction) and 12 columns (X direction). As described in first embodiment, each of the semiconductor chips A1-F20 can be identified by the first and second unique patterns.

Figure 18:
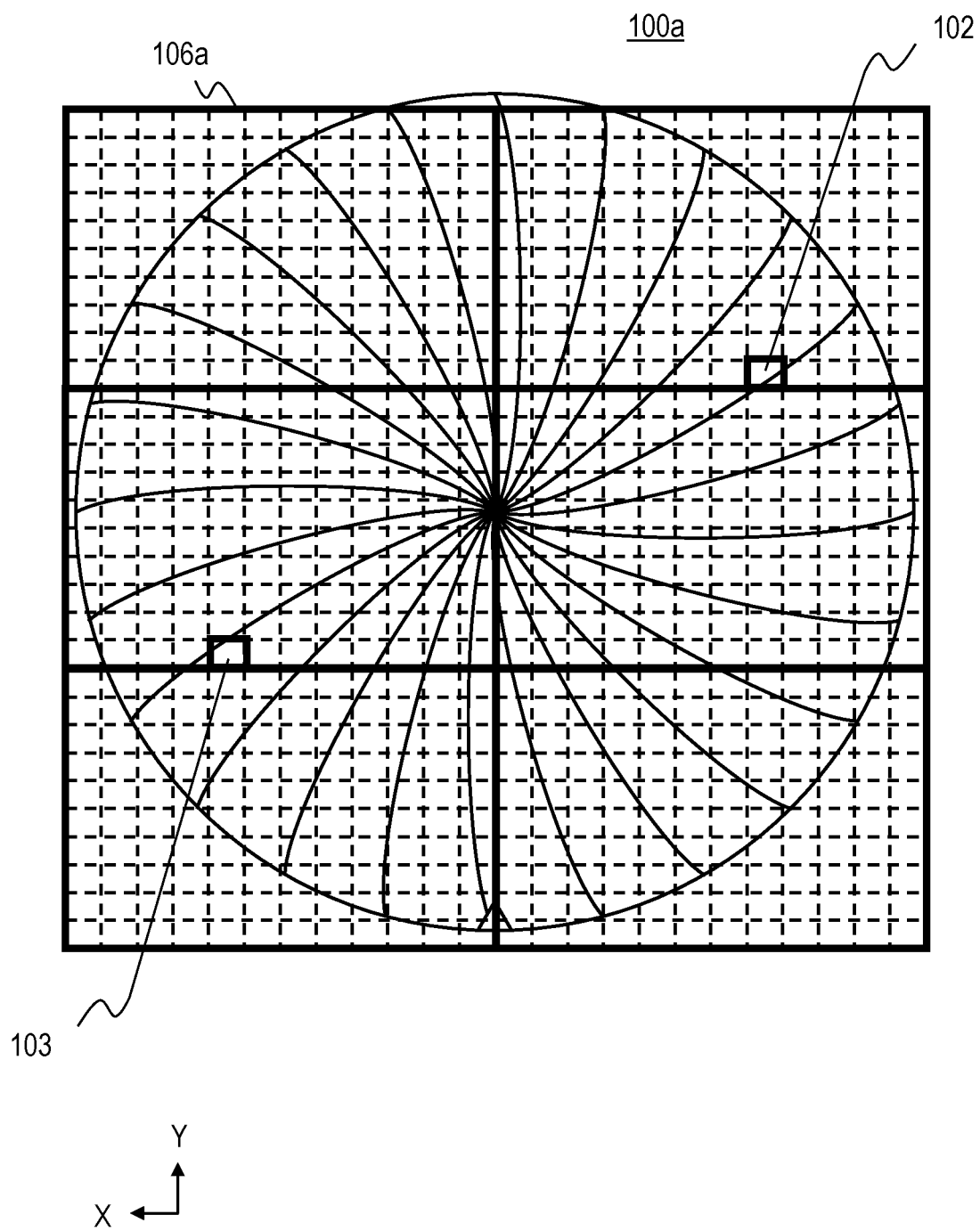
FIG. 18 is a plan view of a backside of a semiconductor wafer according to second embodiment.

FIG. 18 is a view showing the backside view of the semiconductor wafer 100a when the third repeating pattern 106a is applied to the semiconductor wafer 100a. The semiconductor chip 102 described above, in the present second embodiment, is identified as the semiconductor chip E5. Further, the semiconductor chip 103 is identified as the semiconductor chip E20. Therefore, it is possible to identify these two chip positions in the semiconductor wafer (even if the semiconductor chips 102 and 103 have the same grinding marks).

As described above, semiconductor device (semiconductor chip) according to present second embodiment can obtain the same effects as those of first embodiment.

Third Embodiment

In third embodiment, a manufacturing method of semiconductor device and a method for identifying semiconductor device (after dicing) position in the wafer are the same as those in first embodiment. Third embodiment uses a first unique pattern that differs from first embodiment.

Figure 19:
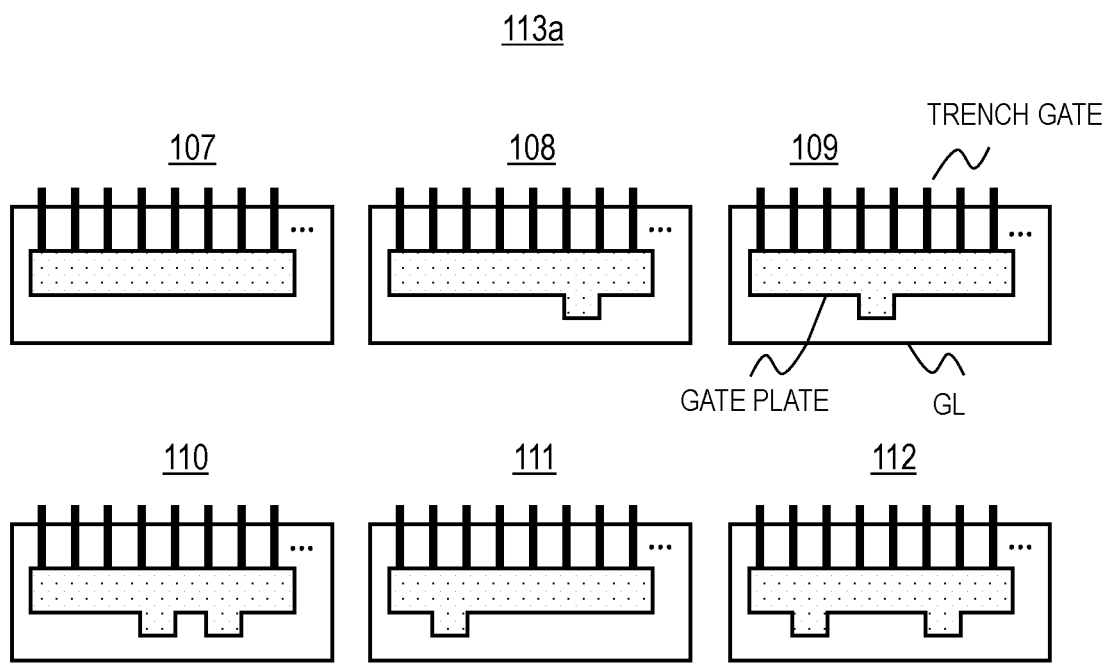
FIG. 19 is frontside view of first unique pattern according to third embodiment.

FIG. 19 is a diagram showing a first unique pattern 113a according to the present third embodiment. In present third embodiment, like first embodiment, the semiconductor chip is the power MOSFET. There is a power MOSFET that has a gate plate between the trench gates and the gate wire. The unique pattern 113a is formed using this gate plate. FIG. 19 is an enlarged view of regions 107-112 of FIG. 9. As shown in FIG. 19, the first unique pattern 113a has different gate plates in the semiconductor chips A to F. For example, comparing 107 and 108 in FIG. 19, 108 has a rectangular gate plate formed with one protrusion. Likewise, 109 to 112 can be specified by the number and location of the protrusions formed on the rectangular gate plate. Therefore, by confirming the shape of the gate plate of the semiconductor chip to be analyzed, it is possible to identify which of the semiconductor chips A to F the semiconductor chip to be analyzed corresponds to.

As described above, semiconductor device (semiconductor chip) according to present third embodiment can obtain the same effects as those of first embodiment.

It should be noted that the present invention is not limited to the above-mentioned embodiments, and various modifications can be made without departing from the gist thereof. For example, the third repeating pattern is defined by a combination of two repeating patterns, but three or more repeating patterns may be combined.

What is claimed is:

1. A semiconductor device manufacturing method comprising:
   forming a plurality of semiconductor devices from a semiconductor wafer; and
   identifying a position of one of the semiconductor devices within the semiconductor wafer, wherein the forming the plurality of semiconductor devices comprises:
  forming a first repeating pattern including i (i is an integer greater than or equal to 2) semiconductor devices each having a unique pattern;
  forming a second repeating pattern including j (j is an integer greater than or equal to 2) semiconductor devices each having a unique pattern;
  defining a plurality of semiconductor devices on the semiconductor wafer such that each of k(>i, j) semiconductor devices has a unique pattern based on the first and second repeating patterns; and
  grinding a backside of the semiconductor wafer,
wherein each unique pattern of the k semiconductor devices is composed of a combination of the unique patterns of the first and second repeating patterns, and
wherein the position of the one of the semiconductor devices is identified based on the unique patterns of the first and second repeating patterns and an angle of a grinding mark of the semiconductor device.

2. The semiconductor device manufacturing method according to claim 1,
wherein the first repeating pattern comprises l-row by m-column of semiconductor devices,
wherein the second repeating pattern comprises n-row by o-column of semiconductor devices,
wherein the k semiconductor devices are semiconductor devices of p-row and q-column,
wherein the p is the least common multiple of the l and the n, and
wherein the q is the least common multiple of the m and the o.

3. The semiconductor device manufacturing method according to claim 1, wherein the first repeating pattern is a multifaceted pattern of semiconductor devices in photolithography.

4. The semiconductor device manufacturing method according to claim 3, wherein the unique pattern of the first repeating pattern is formed of a plurality of trench gates of the i semiconductor devices.

5. The semiconductor device manufacturing method according to claim 4, wherein each of the i semiconductor devices of the first repeating pattern has a different shape of end of the trench gate.

6. The semiconductor device manufacturing method according to claim 3, wherein the unique pattern of the first repeating pattern is formed on each gate plate of the i semiconductor devices.

7. The semiconductor device manufacturing method according to claim 3, wherein the unique pattern of the second repeating pattern is formed at each passivation film aperture area of the j semiconductor devices.

8. The semiconductor device manufacturing method according to claim 7,
wherein the passivation film aperture area has a substantially rectangular shape, and
wherein each of the j semiconductor devices of the second repeating pattern has a different shape of a corner of the passivation film aperture area.

9. The semiconductor device manufacturing method according to claim 1, wherein the j semiconductor devices of the second repeating pattern are semiconductor devices that are measured in parallel in a wafer test.

10. The semiconductor device manufacturing method according to claim 9, wherein the unique pattern of the second repeating pattern is formed of a needle mark of the wafer test.

11. The semiconductor device manufacturing method according to claim 10, wherein the needle mark is formed on each gate pad or each source pad of the j semiconductor devices.

12. The semiconductor device manufacturing method according to claim 2, wherein at least one of a combination of l and n and a combination of m and o is a combination of an even number and an odd number.

* * * * *